(12) United States Patent
Rausch et al.

(10) Patent No.: US 9,966,100 B1
(45) Date of Patent: May 8, 2018

(54) SETTING LASER CURRENT BASED ON MODULATION LEVEL OF AN OPTICAL POWER SENSOR MEASUREMENT

(71) Applicant: Seagate Technology LLC, Cupertino, CA (US)

(72) Inventors: Tim Rausch, Framington, MN (US); Edward Charles Gage, Lakeville, MN (US); Joshua Ward Christensen, Savage, MN (US); Todd Michael Lammers, Lafayette, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days. days.

(21) Appl. No.: 15/671,262

(22) Filed: Aug. 8, 2017

Related U.S. Application Data

(63) Continuation of application No. 15/333,761, filed on Oct. 25, 2016, now Pat. No. 9,741,386.

(51) Int. Cl.
*G11B 5/02* (2006.01)
*G11B 7/00* (2006.01)
*G11B 7/1263* (2012.01)
*G11B 5/012* (2006.01)
*H01S 5/042* (2006.01)
*H01S 5/0683* (2006.01)
*G11B 5/00* (2006.01)

(52) U.S. Cl.
CPC ............ *G11B 7/1263* (2013.01); *G11B 5/012* (2013.01); *H01S 5/042* (2013.01); *H01S 5/0683* (2013.01); *G11B 2005/0021* (2013.01)

(58) Field of Classification Search
CPC .................. G11B 7/1263; G11B 5/012; G11B 2005/0021; G11B 2005/0005; G11B 5/314; G11B 10/00; G11B 5/4907; G11B 5/332; G11B 5/865; G11B 11/10; G11B 11/10595; G11B 11/1053; G11B 11/10586; G11B 2220/90; G11B 19/12; G11B 2220/2537
USPC ........... 360/59, 313, 328, 114.02; 369/13.33, 369/13.34, 116, 122, 47.53, 53.1, 53.37, 369/146
See application file for complete search history.

(56) References Cited

U.S. PATENT DOCUMENTS

| | | |
|---|---|---|
| 4,553,179 A | 11/1985 | Inami et al. |
| 9,153,272 B1 | 10/2015 | Rausch et al. |
| 2010/0128576 A1 | 5/2010 | Fang et al. |
| 2015/0332725 A1 | 11/2015 | Rausch et al. |

*Primary Examiner* — Nabil Hindi
(74) *Attorney, Agent, or Firm* — Hollingsworth Davis, LLC

(57) ABSTRACT

Before writing to a heat-assisted magnetic recording medium, a DC signal modulated with an AC signal is applied to a laser of a read/write head. A modulation level of an optical power sensor is measured, the optical power sensor being coupled to detect optical output of the laser in response to the modulated current. A target value of the DC signal that causes the modulation levels to reach a predetermined value between zero and a maximum value is determined and used to set a bias current for subsequent activation of the laser based.

20 Claims, 9 Drawing Sheets

SETTING LASER CURRENT BASED ON MODULATION LEVEL OF AN OPTICAL POWER SENSOR MEASUREMENT

RELATED PATENT DOCUMENTS

This application is a continuation of U.S. Ser. No. 15/333,761, filed on Oct. 25, 2016, to which priority is claimed and which is incorporated herein by reference in its entirety.

SUMMARY

The present disclosure is directed to setting laser current based on modulation level of an optical power sensor measurement. In one embodiment, before writing to a heat-assisted magnetic recording medium via a laser of a read/write head, a laser signal is applied to the laser. The laser signal includes a DC signal modulated with an AC signal. In response to different values of the DC signal, modulation levels are measured of an optical power sensor that is coupled to detect optical output of the laser in response to the laser signal. A target value of the DC signal is determined that causes the modulation levels to reach a predetermined value between zero and a maximum value. The target value defines a threshold current above which the laser begins to emit light. A bias current for subsequent activation of the laser is set based on the threshold current.

In another embodiment, two or more different modulated DC signals are applied to a laser used for writing data to a heat-assisted magnetic recording medium. Responsive to the two or more different modulated DC signals, corresponding two or more modulation levels are measured of an optical power sensor that is coupled to detect an optical output of the laser. Based on the two or more modulation levels of the optical power sensor, a target modulated DC signal is determined that causes a target modulation level of the optical power sensor. A threshold current of the laser is determined that corresponds to a DC component of the target modulated DC signal. A bias current of the laser is set based on the threshold current.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure generally relates to data storage devices that utilize magnetic storage media, e.g., disks. Data storage devices described herein use a particular type of magnetic data storage known heat-assisted magnetic recording (HAMR), also referred to as energy-assisted magnetic recording (EAMR), thermally-assisted magnetic recording (TAMR), thermally-assisted recording (TAR), etc. This technology uses an energy source such as a laser to create a small hotspot on a magnetic disk during recording. The energy from the laser is coupled into an optical waveguide path and directed to a near-field transducer that shapes and directs the energy to heat the recoding medium. The heat lowers magnetic coercivity at the hotspot, allowing a write transducer to change magnetic orientation, after which the hotspot is allowed to rapidly cool. Due to the relatively high coercivity of the medium after cooling, the data is less susceptible to data errors due to thermally-induced, random fluctuation of magnetic orientation known as the superparamagnetic effect.

Because the magnetic field applied during recording is typically much larger than the hotspot, the size of the hotspot defines the size of the recorded bits of data. If there are changes to the hotspot size, then performance may suffer. For example, if the hotspot is too large, then adjacent track data may be overwritten. If the hotspot is too small, the current track being recorded will not have sufficient signal and therefore poor bit error rate (BER).

A number of components and parameters can affect the hotspot size. One of these components is the laser diode itself, the output of which can be changed by changing the drive current. Generally, when the read/write head is performing non-write activities, such as adjacent track seek or traversing servo marks, the laser may be kept in a partially active state from which it can be quickly activated. This involves applying a bias current to the laser that causes partial activation, e.g., the laser emits light at a low level such that its output is insufficient to heat the recording medium but still can be detected.

While the initial biasing current to partially activate the laser can be set in the factory, the properties of the laser change over time and in response to environmental conditions, e.g., ambient temperature. Therefore, a data storage device according to an example embodiment will perform regular measurement of the laser's response and, if needed, adjustment of bias current used to achieve the desired level of partial activation. A bolometer located in or near a light transmission path is used to perform this measurement and adjustment.

Figure 1:
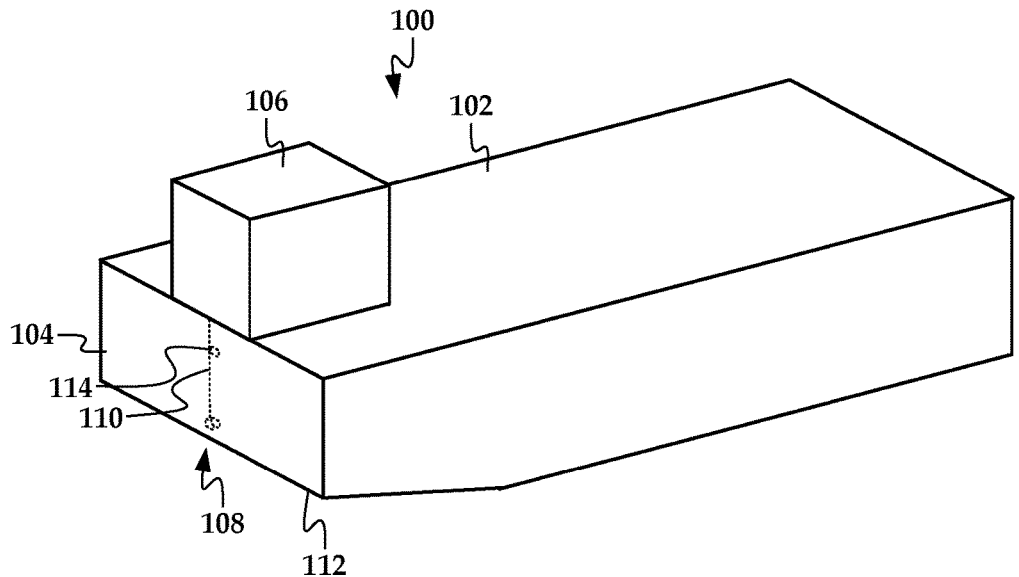
FIG. 1 is a perspective view of a slider assembly according to an example embodiment.

In reference now to FIG. 1, a perspective view shows a read/write head 100 according to an example embodiment. The read/write head 100 may be used in a magnetic data storage device, e.g., HAMR hard disk drive. The read/write head 102 may also be referred to herein interchangeably as a slider, write head, read head, recording head, etc. The read/write head 100 has a slider body 102 with read/write transducers at a trailing edge 104 that are held proximate to a surface of a magnetic recording medium (not shown), e.g., a magnetic disk.

The illustrated read/write head 100 is configured as a HAMR device, and so includes additional components that form a hot spot on the recording medium near the read/write transducer 108. These components include an energy source 106 (e.g., laser diode) and a waveguide 110. The waveguide 110 delivers electromagnetic energy from the energy source 106 to a near-field transducer that is part of the read/write transducers 108. The near-field transducer achieves surface plasmon resonance in response to the coupled light and directs the energy out of a media-facing surface 112 to create a small hot spot on the recording medium.

An optical power sensor, e.g., bolometer 114, is located at or near a light path (e.g., waveguide 110) to detect emissions from the laser diode 106. The bolometer 114 may be configured as a wire or other absorptive element that has a known change in resistance due to changes in temperature, which is expressed by the temperature coefficient of resistance (TCR). The bolometer 114 may be selected from materials that are sensitive to the wavelengths emitted from the laser diode 106, and is coupled to sensing circuitry as known in the art. Generally, the output of bolometer 114 will extend from a lower output where the laser diode 106 is switched off to a higher output where the laser diode 106 is activated at an operational power level sufficient to heat the recording medium. It should be noted that the bolometer 114 need not be a special-purpose or separate device. For example, some read/write heads may use a sensor for measuring temperature changes indicative of head-to-media clearance, and this sensor can be used for optical power measurements as described herein. In other embodiments, a reader stack and/or or writer coils may be used to detect optical power in response to temperature. Generally, any device in the read write head whose resistance changes in response to optical power can be used, assuming such resistance change can be measured.

Figure 2:
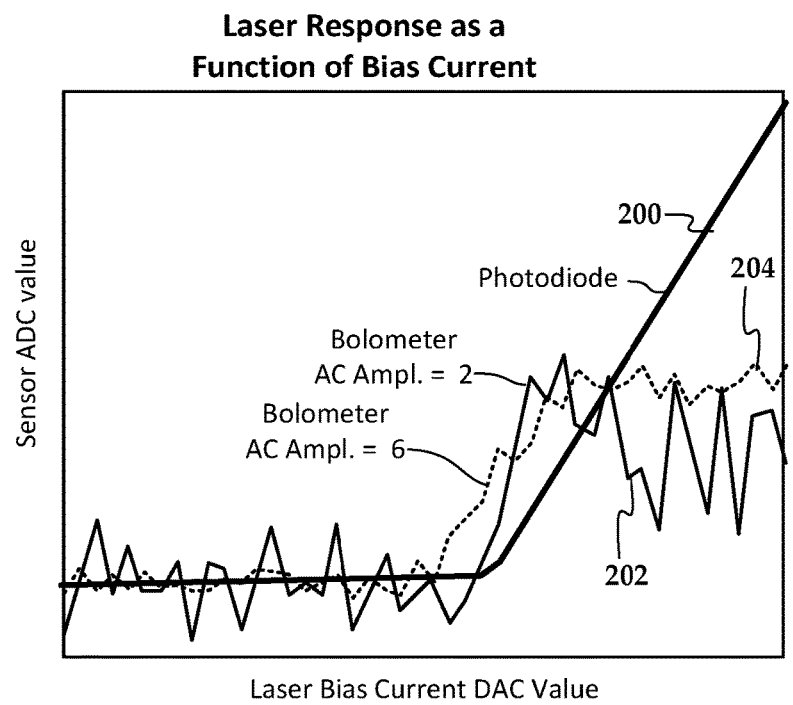
FIG. 2 is a graph of a laser and optical power sensor response according to an example embodiment.

Generally, the laser diode 106 is activated using a DC current. Testing was performed with a number of bolometer configurations, and it was found that using a DC laser bias current resulted in a noisy bolometer signal. However, if the DC signal is modulated, e.g., combined with a sine wave, then the signal from the bolometer is less noisy. In FIG. 2, a graph shows measured output of a bolometer according to an example embodiment. The photodiode trace 200 represents photodiode measurements of the laser output as a function of current. Traces 202 and 204 represent measured output of a bolometer that is coupled to detect light from the laser over the same current range, where the current was modulated with an AC sine wave. The laser current used to obtain trace 202 was modulated with a smaller peak-to-peak AC waveform than used to obtain curve 204. This shows that higher levels of AC modulation tend to smooth out the bolometer response, but both exhibit a similar shape.

Figure 3:
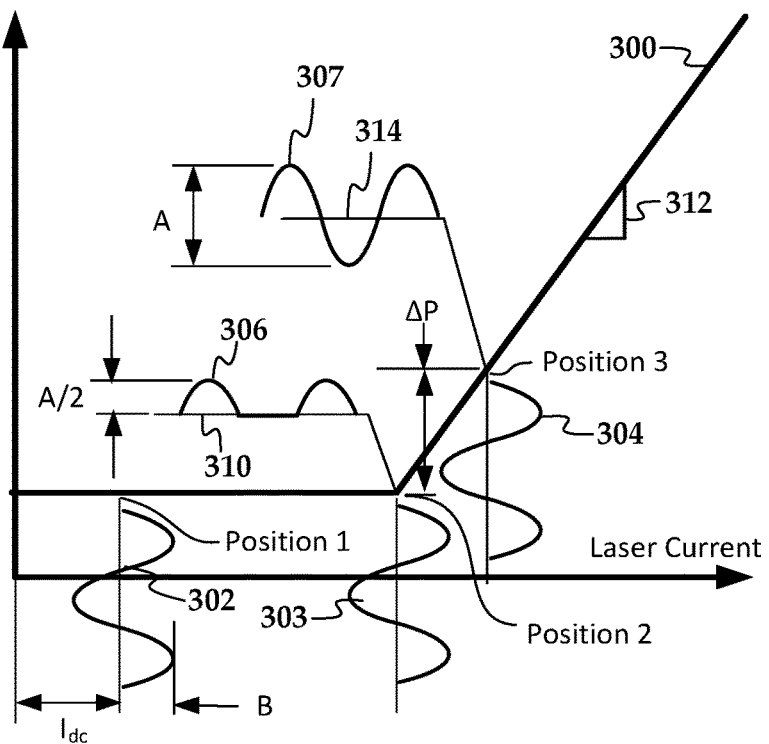
FIG. 3 is a graph showing modulated bias applied to a laser according to an example embodiment.

In FIG. 3, a graph shows a modulated laser bias signal and associated bolometer response according to an example embodiment. Curve 300 represents the optical output of a laser in response to an applied laser current. As indicated by waveforms 302-304, the laser bias current is modulated at various current levels. For example, the time varying equation for the applied modulated current may be $I_{mod} = I_{bias} + B \cos(\omega t)$, where $I_{bias}$ is the DC component, $B \cos(\omega t)$ is the modulating value, and $\omega$ is the modulating frequency. In this example, B is a constant, however B can change at different values of $I_{bias}$. For example, B can be set to be some percentage of the initial value of $I_{bias}$ used at the start of the procedure. The frequency $\omega$ may also be constant, although there may be an optimal range from which $\omega$ can be selected. If the frequency is too high, the bolometer may have a poor AC response. If the frequency is too low, the level of DC noise will be excessive.

At Position 1, the bolometer may have a significant DC output, however there is minimal AC output at the target frequency $\omega$ since the laser is below the threshold current, although noise may induce some small amount of AC output at this frequency. At Position 2, the laser is just beginning to energize at the laser threshold current, e.g., due to positive peaks of bias current waveform 303 causing light to be emitted. As seen by bolometer waveform 306, this causes peaks at the modulation frequency $\omega$ to be superimposed on the DC signal floor of the bolometer, the DC signal floor being indicated by line 310. The peak value of the waveform 306 is A/2, where A is a maximum value as seen in FIG. 2. Position 2 is the knee of the laser output curve 300, which occurs at laser threshold current $I_{th}$.

At Position 2, the A/2 amplitude of the bolometer AC component corresponds to half the total amplitude resulting from the modulation of the laser current. At currents higher than $I_{th}$ at Position 2, the optical output along curve 300 is linearly proportional to the laser diode current, as indicated by slope 312. The slope 312 is also referred to as the slope efficiency, as it represents the change in optical output power $\Delta P$ in response to a change in current $\Delta I$. As will be described in greater detail below, the AC modulated laser current and bolometer response can also be used to determine the slope efficiency, which may also change over time, e.g., due to changes in temperature.

At Position 3, the laser bias current is sufficient to cause the bolometer output, as indicated by waveform 307, to be a fully-sine-modulated DC signal (e.g., no clipping) with peak-to-peak sine amplitude of A. This is because the lowest value of the waveform 304 is at or above the threshold voltage, therefore the laser is illuminated for all values of the current waveform 304. Note that the line 314 thru waveform 307 represents the time-average DC value of the bolometer output. As the modulated laser bias current increases beyond Position 3, the DC value of the bolometer output will increase, however, the AC component of the bolometer signal will remain about the same because the AC modulation component $B \cos(\omega t)$ of the laser current is constant. This gives the bolometer AC amplitude response the s-shape as shown in FIG. 2 and discussed further below in relation to FIG. 4.

Figure 4:
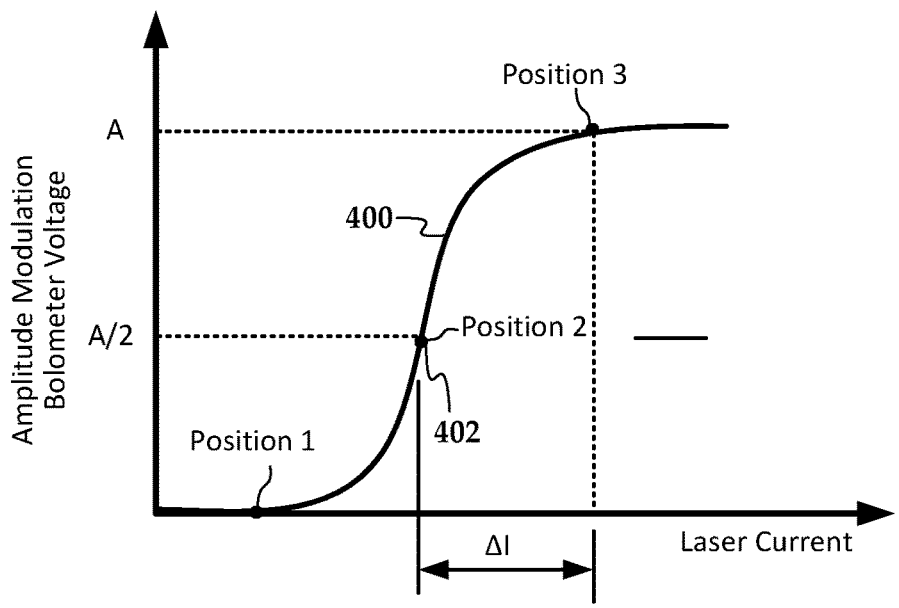
FIG. 4 is a graph of a AC modulation response of a bolometer according to an example embodiment.

An example of the bolometer AC modulation amplitude curve 400 is shown in FIG. 4. This curve 400 represents the amplitude of the AC component of the bolometer signal. The curve 400 is s-shaped, asymptotically approaching zero as the bias current drops below threshold and asymptotically approaching an output level A. At output level A, the bias current becomes large enough so that the modulated laser bias current is always above the threshold current and therefore continuously activates the laser. The curve 400 can be used to determine a target amplitude value at Position 2, the target value being used to adjust laser bias current $I_{bias}$ just before writing. The target value is at or near the threshold current $I_{th}$ of the laser, and the laser bias $I_{bias}$ may be adjusted to correspond to $I_{th}$ or be different from $I_{th}$ by a known offset.

In some operational scenarios, it is expected that the value of A on curve 400 will remain fairly constant during relatively long periods of operation. In such a case, the device need not fully plot out the curve 400 every time that the laser bias current is set; the last measured value of A can be repeatedly used for multiple settings of bias current. However, the curve 400 may be replotted as needed, e.g., in response to large changes in local conditions (e.g., ambient temperature) or in response to a timer (e.g., after a predetermined number of hours of writing). Between those times, the value of A can be stored in memory and used to set the bias current as needed, which may occur regularly during operation of the device.

For example, during an adjacent track seek (ATS), the laser bias current could be checked by applying a modulated laser bias current to the laser and looking at the magnitude of the AC component of the bolometer signal at the target frequency. If the AC component is not at the target level (e.g., A/2), the laser bias is adjusted until the AC magnitude of the bolometer signal is A/2, which is at or near point 402 on curve 400. Point 402 corresponds to Position 2 shown in FIG. 3, which corresponds to the threshold current Ith. In some cases, it may be desired to set the laser bias to a value that is greater than or less than Ith. As such, other values on the curve 400 between zero and A could be used as the laser bias set point, e.g., A/4, A/3, 2A/3, 3A/4, etc.

In some cases, the system may not have enough time during an adjacent track seek to read the AC component of the bolometer, make a correction and read the AC component again more than once or twice. If the AC component does not converge to a target value during one adjacent track seek, the process can continue over subsequent adjacent track seeks. For example, if ten iterations are needed to reach the correct value and two measurement/adjustments can be made per adjacent track seek, it would take five adjacent track seeks to make the correction.

The modulation of the laser bias according to $I_{bias} = I_{dc}$ B $\cos(\omega t)$ as shown in FIGS. 3 and 4 need only occur during a non-writing event when curve 400 is determined and/or when the laser bias current is adjusted to accommodate for temperature and other changes. At other times, a DC current will be applied to the laser (e.g., during writing, at idle). Checking (and, if needed, setting) of the DC bias current $I_{bias}$ may occur repeatedly during events that occur just before writing (e.g., during ATS, long seek, during traversal of a servo mark). When writing commences after the pre-writing event, a predetermined DC operational offset current $I_{OP}$ is added to DC bias current $I_{bias}$ to fully energize the laser. The value of $I_{OP}$ may be relatively fixed for a particular time and region of the recording medium, and so setting the bias current $I_{bias}$ to the correct operating point ensures the correct output of the laser during writing in response to current $I = I_{bias} + I_{OP}$. As will be described in greater detail below, the optimal value of $I_{OP}$ may change depending on the slope efficiency 312 shown in FIG. 3, and the curve 400 shown in FIG. 4 may also be used to determine slope efficiency and adjust $I_{OP}$ accordingly.

Figure 5:
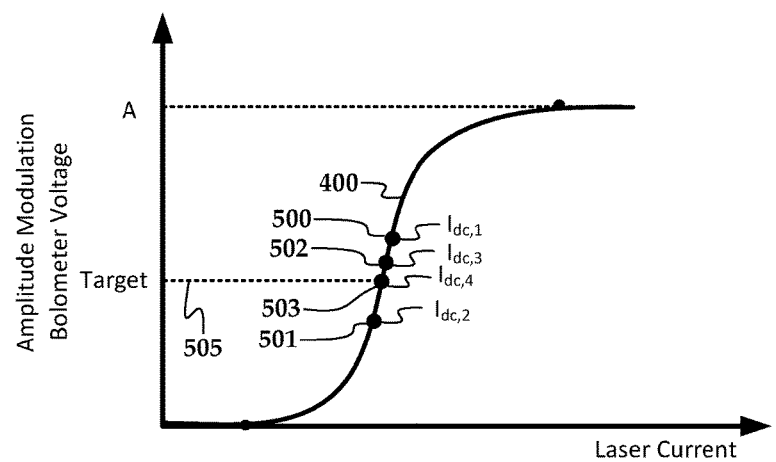
FIG. 5 is a graph showing setting of laser bias current according to an example embodiment.

In FIG. 5, a graph shows how the bias current can be checked and set according to an example embodiment. In FIG. 5, the curve 400 from FIG. 4 is used to represent the response of the bolometer AC modulation as a function of laser bias current. This curve 400 may have been previously determined before the procedure occurs, although in some cases may be derived as part of the procedure. Line 505 represents a target value on the curve 400, e.g., A/2. An initial value of the modulated bias current, $I_{bias} = I_{dc,1} + B \cos(\omega t)$ is applied to the laser diode and the corresponding point 500 is measured. The DC component, $I_{dc,1}$, of the modulated current may have been the value of $I_{bias}$ previously used for the last writing operation.

Point 500 is too high above the target value 505, and so a bias current, $I_{bias} = I_{dc,2} + B \cos(\omega t)$ is applied resulting in measured point 501. The value of $I_{dc}$ is further adjusted to obtain points 502 and 503, the value of point 503 being at the desired value along curve 400. The DC bias value $I_{dc,4}$ corresponding to point 503 is used as the new value of $I_{bias}$. Before writing, the modulation is removed and at the start of writing an operational current $I_{OP}$ is added to the adjusted value of $I_{bias}$. For the next non-writing event, e.g., during the next ATS, the current value $I_{dc,4}$ is used as the new starting value and the illustrated procedure repeats.

The time to perform the adjustment shown in FIG. 5 may be limited by system specifications. For example, in one arrangement, about 200 μs is available during an ATS to measure the bolometer amplitude from a modulated signal and make at least one adjustment. The measurement should take no more than half of this time, as the laser may need the remainder of the time to stabilize at full power. In order to quickly make such a measurement, the procedure shown in FIG. 5 may perform a limited number of iterations. In some configurations, drive preamplifier circuitry used may utilize specialized hardware to quickly drive the laser diode with the modulated current and read the bolometer response.

Figure 6:
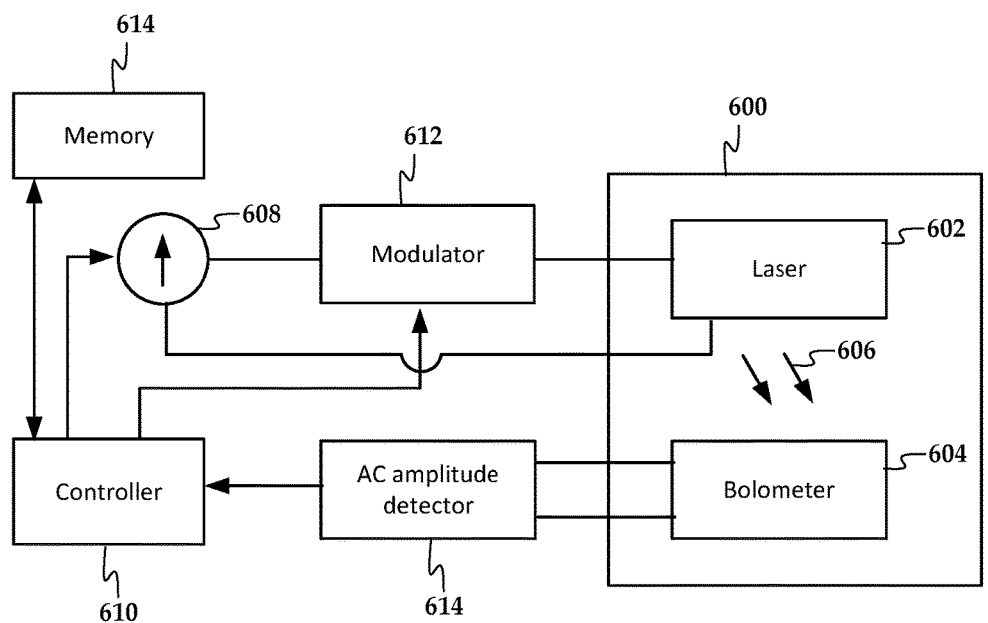
FIG. 6 is a block diagram of a laser calibration circuit according to an example embodiment.

In FIG. 6, a block diagram illustrates a measurement circuit according to an example embodiment. A read/write head 600 includes a laser 602 and a bolometer 604 that is coupled to receive light 606 emitted from the laser 602. The laser 602 is driven by a current source 608 when activated by a controller 610. A modulator 612 can be switched on by the controller 610 to modulate the current applied to the laser 602 at a predetermined frequency. The bolometer 604 detects the light 606 produced by the modulated signal. An AC amplitude detector 614 determines an AC component of the bolometer signal at the predetermined frequency, and a measure of this AC amplitude is sent to the controller 610. The measurement is compared to a reference value of AC amplitude stored in memory 614 (e.g., A/2). Based on the measurement and comparison, a new value of $I_{bias}$ may be set and stored in the memory 614 for at least one subsequent write operation, e.g., until another measurement of bolometer AC amplitude is performed.

A number of circuits may be used as the AC amplitude detector 614. For example, a diode and capacitor placed in series will output a DC voltage (measured across the capacitor) equal to the peak value of an AC signal applied to the series diode and capacitor. This is known as a peak detector or envelope detector. In other embodiments, a lock-in amplifier can be used. A lock in amplifier can extract the amplitude of the AC component at the target frequency from a noisy environment.

In other embodiments, digital signal processing circuits can be used to detect AC amplitude at the target frequency. For example, a simple sine wave has no harmonics, and so a transform of the sine wave to frequency domain (e.g., using a Fast Fourier Transform, or FFT) will appear as an impulse/delta function at the frequency of the sine wave. However, as indicated by curve 306 in FIG. 3, if the laser is biased at the threshold current, the output of the bolometer may appear as a clipped sine wave. The distortion amplitudes relative to the main peak in the spectrum may be used to find the target operating point. Hard drives may already include a harmonic sensor that can measure two frequencies at once (e.g., for determining head-to-media clearances). The bolometer output may be routed to harmonic sensing circuitry in the preamplifier to determine the main peak and a distortion peak.

Figure 7:
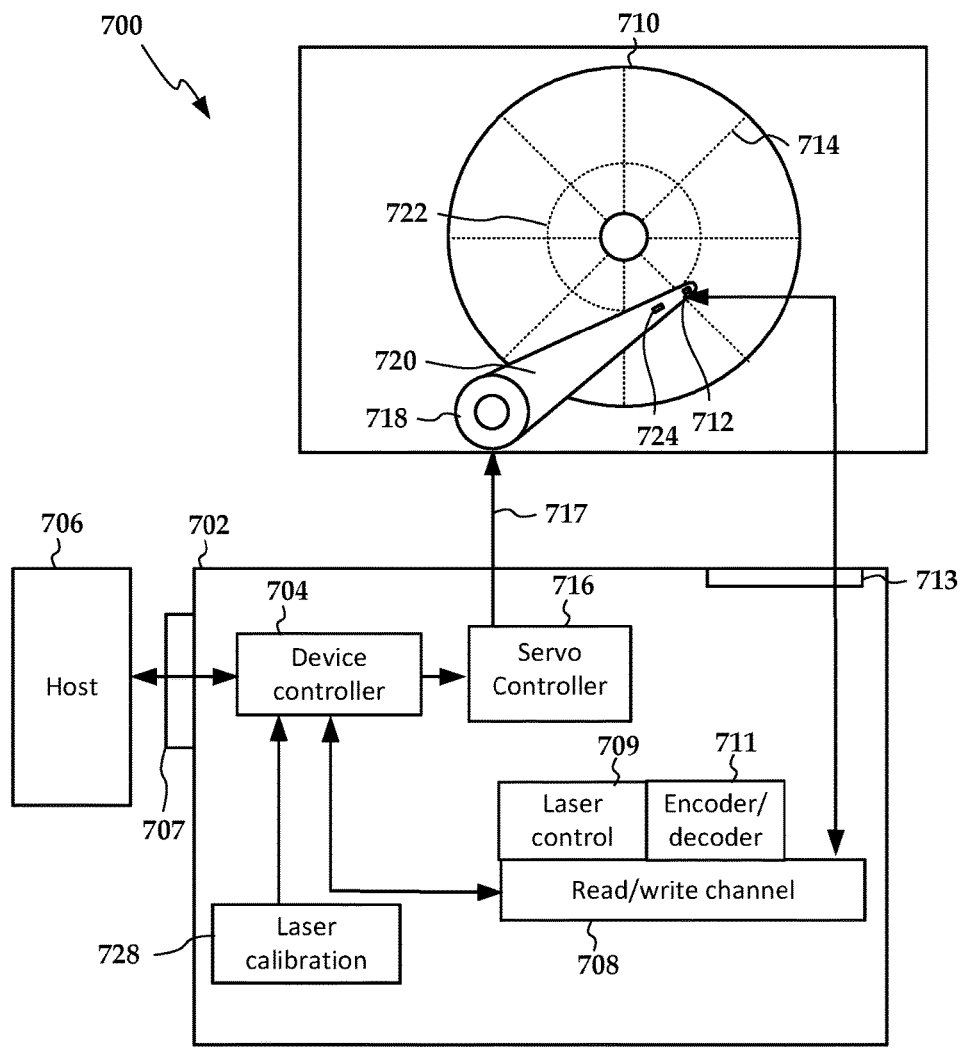
FIG. 7 is a block diagram of an apparatus according to an example embodiment.

In FIG. 7, a diagram illustrates components of a data storage device 700 (e.g., hard disk drive apparatus) according to an example embodiment. The apparatus includes circuitry 702 such as a system controller 704 that processes read and write commands and associated data from a host device 706. The host device 706 may include any electronic device that can be communicatively coupled to store and retrieve data from a data storage device, e.g., a computer. The system controller 704 is coupled to a read/write channel 708 that reads from and writes to surfaces of one or more magnetic disks 710.

The read/write channel 708 may include analog and digital circuitry such as decoders, timing-correction units, error correction units, etc. The read/write channel is coupled to the heads via interface circuitry 713 that may include preamplifiers, filters, digital-to-analog converters, analog-to-digital converters, etc. The read/write channel 708 generally converts data between the digital signals processed by the system controller 704 and the analog signals conducted through two or more read/write heads 712 during read operations. At least one of the read/write heads 712 includes a laser used to heat a spot on the magnetic disk 710 during recording of data. A laser control module 709 controls various aspects of the laser operation during both reading and writing. The laser module 709 may dictate when the laser is switch on and off, set laser current based on various conditions, monitor laser power, e.g., via a bolometer on the read/write head 712. Generally, the read/write channel 708 provides facilities for communicating this and other control/sensor data with the read/write heads 712.

In addition to processing user data, the read/write channel 708 reads servo data from servo wedges 714 on the magnetic disk 710 via the read/write head. All of the multiple readers of the read/write head may be used to read servo data, or only a subset thereof. The servo data are sent to a servo controller 716, which uses the data to provide position control signals 717 to a VCM 718. The VCM 718 rotates an arm 720 upon which the read/write heads 712 are mounted in response to the control signals 717. The position control signals 717 may also be sent to microactuators 724 that individually control each of the read/write heads 712, e.g., causing small displacements at each head.

A laser calibration module 728 performs a calibration that includes modulating a bias current applied to a read/write head laser and reading the signal back via a bolometer and other signal processing circuits as described above. The timing of the calibration may be coordinated with the servo controller 716. For example, the servo controller 716 commands the read/write heads 712 to move to a new track and detects when the read/write heads are positioned over the target track, and so can be used to provide timing signals for the laser calibration. Other events detected by the servo controller 716 for purposes of scheduling a laser calibration include a long seek, and traversal of servo marks.

Figure 8:
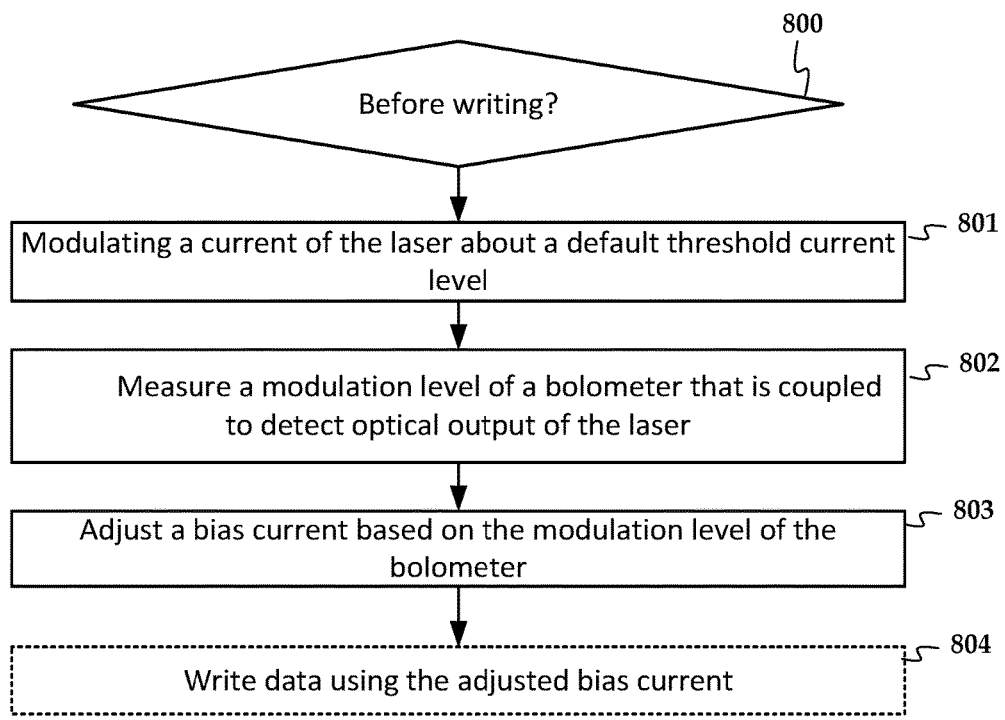
FIG. 8 is a flowchart of a method according to an example embodiment.

In FIG. 8, a flowchart shows a method of setting a laser current according to an example embodiment. The method involves determining 800 an event before writing with the laser. The laser is part of a read/write head that is used to write to a heat-assisted magnetic recording medium. The setting of the laser current involves modulating 801 a current of the laser about a default threshold current level, e.g., a previously measured laser threshold current. A modulation level of a bolometer that is coupled to detect optical output of the laser is measured 802. The modulation level is the magnitude of the AC component of the bolometer signal. A bias current is adjusted 803 for subsequent activation of the laser based on the modulation level of the bolometer. The laser may be activated for writing data 804 using the adjusted bias current. For example, a predetermined current may be added to the bias current to achieve a desired optical power for recording data. The bias current may be the same as or different from the threshold current.

Figure 9:
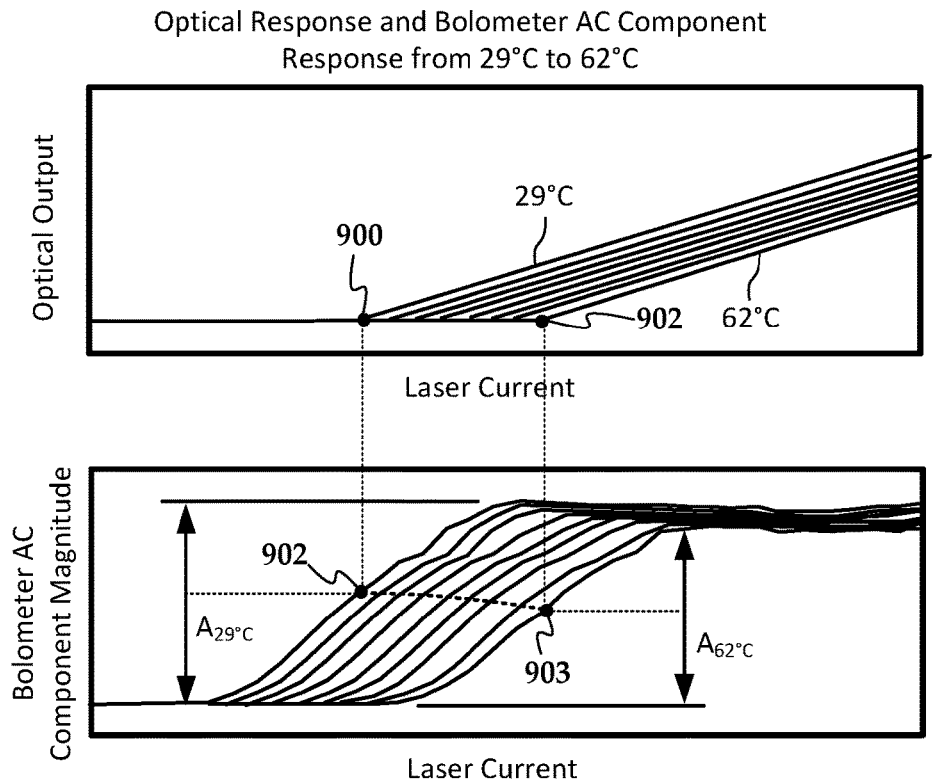
FIGS. 9 and 10 are graphs showing temperature-dependent performance of an apparatus according to an example embodiment.

The methods and apparatuses described above were tested in order to determine effectiveness over a range of temperatures. In FIG. 9, a set of graphs shows results of tests on an apparatus configured according to an embodiment described above. The top graph shows optical output of a laser in response to current over a range of temperatures. The bottom graph shows measurements of AC component magnitude from a bolometer for the same range of currents and temperatures. As seen by points 900 and 901 in the top graph, the threshold current increases with the temperature. This increase in threshold current is also seen in the bottom graph at corresponding points 902 and 903. Therefore, the vertical midpoints of the bottom curves accurately predict the threshold current across a range of temperature.

As indicated by amplitude differences $A_{29° C.}$ and $A_{62° C.}$ in the bottom graph of FIG. 9, the bolometer response changes as a function of temperature. This can be used to determine if and when a new calculation of the value of A may be needed. For example, the value of A for a mid-temperature curve (e.g., at 45° C.) may be used if the resulting error in the calculation of threshold current is acceptable. In other cases, a target error in calculating threshold current can be used to derive a temperature change that results in recalculating the bolometer curve. For example, if ambient temperature changes by 10° C. from when the last curve was derived, a new curve can be run and the value of A determined from that curve.

While the above embodiments describe using the vertical difference A between the asymptotic parts of the bolometer AC component response, the horizontal difference between the asymptotic parts can also be used to determine slope efficiency. In reference again to FIG. 4, location of Position 3 is indicative of the slope efficiency of the laser (e.g., slope efficiency as indicated by slope 312 in FIG. 3) For example, assume that the difference in optical output power ΔP of the laser (see FIG. 3) that induces the change in amplitude A shown curve 400 is relatively constant as a function of temperature. Therefore, the slope efficiency M can be calculated as M=ΔP/ΔI, where ΔI is determined from the curve 400 of FIG. 4.

Figure 10:
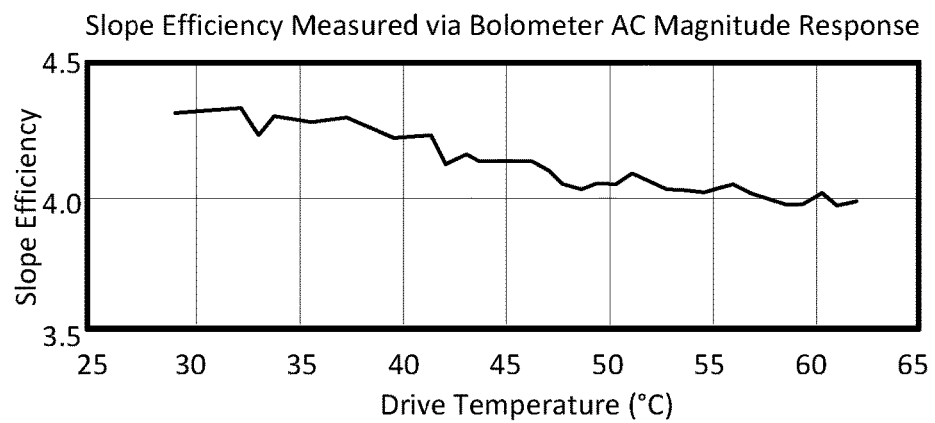

Using the measurements used to obtain the data shown in the graphs of FIG. 9, slope efficiency was calculated as shown in the graph of FIG. 10. As expected, the slope efficiency decreases as temperature increases, and does so fairly linearly. This result can be used to change the laser operational current $I_{OP}$ in response to changes in ambient temperature. For example, if $I_{OP}$ is to induce a desired change in power level $\Delta P_{OP}$, then $I_{OP}=\Delta P_{OP}/M_{amb}$, where $M_{amb}$ is the slope efficiency measured at the current ambient temperature using the bolometer response described above. It will be understood that the slope efficiency can be recalculated for other conditions besides change in ambient temperature, such as aging of the laser.

Figure 11:
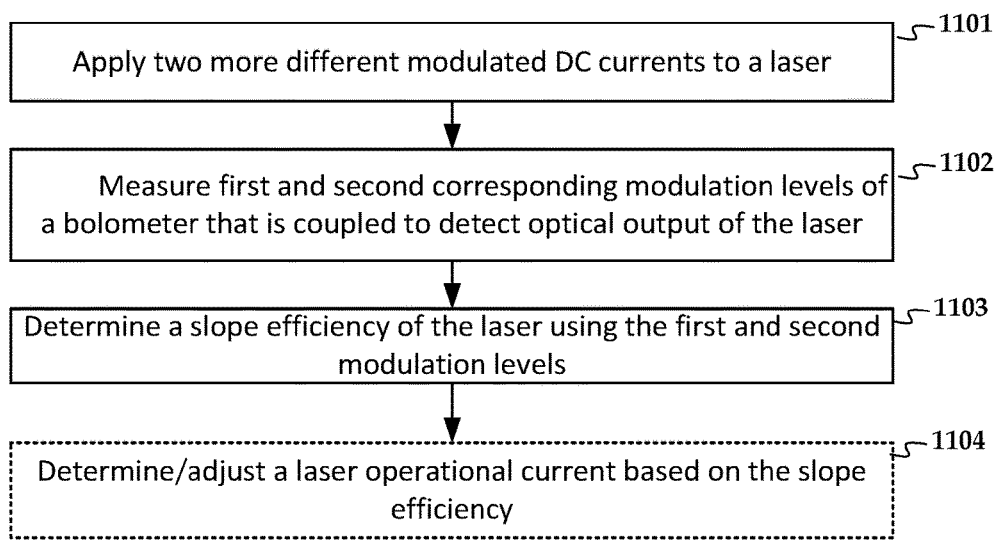
FIG. 11 is a flowchart of a method according to another example embodiment.

In FIG. 11, a flowchart illustrates a method according to another example embodiment. The method involves applying 1101 at least two different modulated DC currents to a laser used in writing data to a heat-assisted magnetic recording medium. For example a series of modulated currents in the form of $I_{dc}+B \cos(\omega t)$ can be applied for different values of $I_{dc}$, e.g., where B and ω are constant. First and second modulation levels of a bolometer are measured 1102. The bolometer is coupled to detect an optical output of the laser in response to the at least two modulated DC currents. The first and second modulation levels respectively correspond to a first of the modulated DC currents that causes the laser to begin emitting light (e.g., Positions 1 or 2 in FIG. 4) and a second of the modulated DC currents that is large enough to continuously activate the laser (e.g., Position 3 in FIG. 4). A slope efficiency of the laser is determined 1103 based on the first and second modulated DC currents. A laser operational current $T_{OP}$ can optionally be determined and/or adjusted 1104 based on the slope efficiency.

Figure 12:
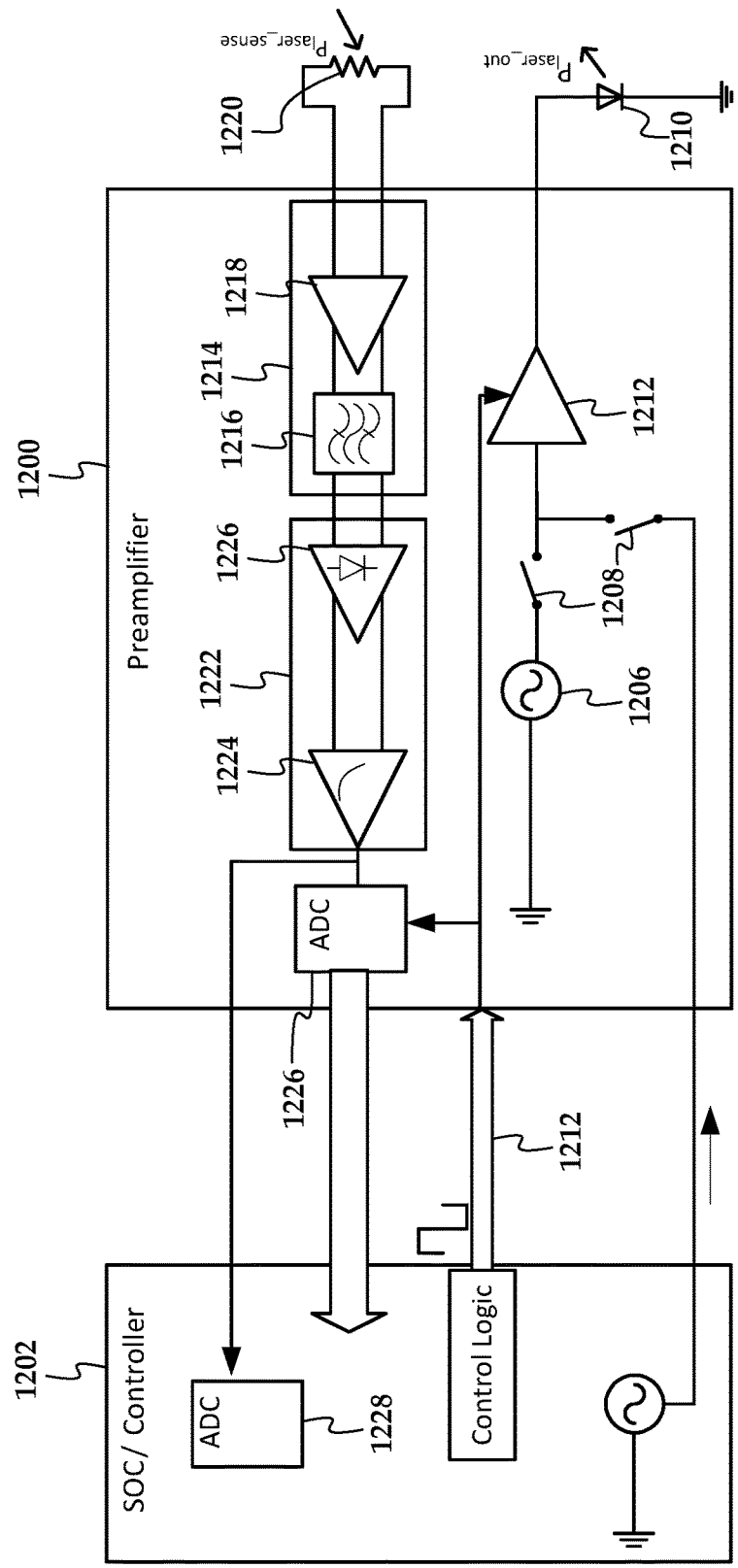
FIG. 12 is a block diagram of a preamplifier according to an example embodiment; and In FIGS. 13-16 are graphs illustrating signals associated with the preamplifier arrangement shown in FIG. 12.

The methods described above can be implemented in a preamplifier circuit. Several features described below may be enabled via firmware and/or setup (e.g., grounding of pins). In one embodiment, the preamp would allow the user to enable laser modulation internally (or source externally), enable automatic laser bias increments controlled via external logic to preamp, enable the AC sensing path of the bolometer, and enable an demodulator/envelop detector with automatic digitization scheme to enable to the capture of the laser current sweep as seen by the AC path of the TCR sensor. In FIG. 12, these features are shown in a block diagram illustrating a preamplifier 1200 according to an example embodiment.

As seen in FIG. 12 the modulation can be provided externally to the preamplifier 1200, as indicated by oscillator 1204 in system-on-a-chip (SoC)/controller 1202. The modulation could also be internal to the preamplifier 1200 to save pins and external hardware lines, as indicated by oscillator 1206. Switches 1208 allow selecting between internal and external modulation. The modulation is applied to laser diode 1210 via laser driver. The laser current can be auto incremented at trigger points controlled by the rising edge of an external logic line 1212. A sensor path 1214 includes an amplifier 116 and bandpass filter 1218 to process incoming signals from a bolometer 1220. The sensor path 1214 monitors the response from the bolometer 1220 during laser modulation and laser bias auto increment.

An envelop detector 1222 is coupled to the sensor path 1214. The envelop detector 1222 acts as a demodulator to get an average energy of the incoming signal from the AC path 1214. The envelop detector includes a rectifier 1226 whose output is fed into a low-pass filter 1224. The output of the envelop detector/demodulator would then be used as an input to the either an onboard analog-to-digital converter (ADC) 1226 or other off-chip ADC circuits 1228. The on-chip ADC 1226 can be digitized at specific intervals determined by the switching of the same external logic signal lines 1212 controlled by the SOC 1202. For example, if the incrementing and application of laser current occurs in response to a rising edge from the logic signal lines 1212, the acquisition by ADC 1226 can be triggered by a falling edge of the same signal lines 1212.

Figure 13:
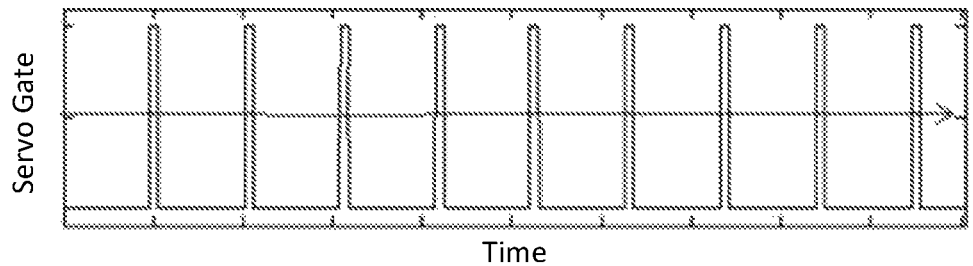
Figure 14:
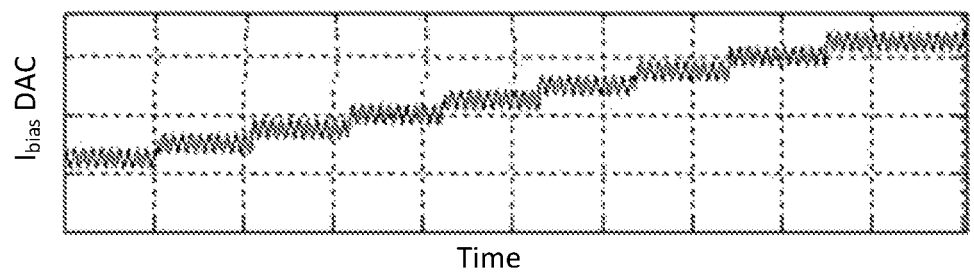

In FIGS. 13-16, graphs illustrate signals associated with the preamplifier arrangement shown in FIG. 12. The system firmware can setup the preamplifier 1200 to enable the laser threshold measurement assist. Once this is done the laser $I_{bias}$ auto-increments around servo wedge via a hardware line toggle edge detection until it reaches a programmed final value. The servo gate signal is shown in the graph of FIG. 13, and the laser bias signal is shown in the graph of FIG. 14. During the auto-increment of the mean $I_{bias}$ the signal applied to the laser 1210 is modulated about $I_{bias}$ either using on-chip or off-chip modulation. Once the final value is reached the preamplifier assist is turned off and the laser drive returns to normal operation.

Figure 15:
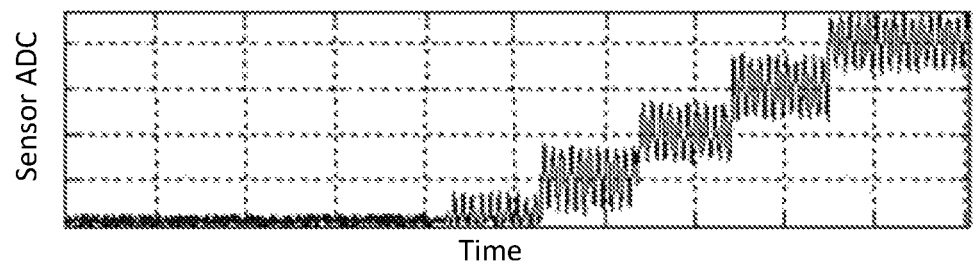
Figure 16:
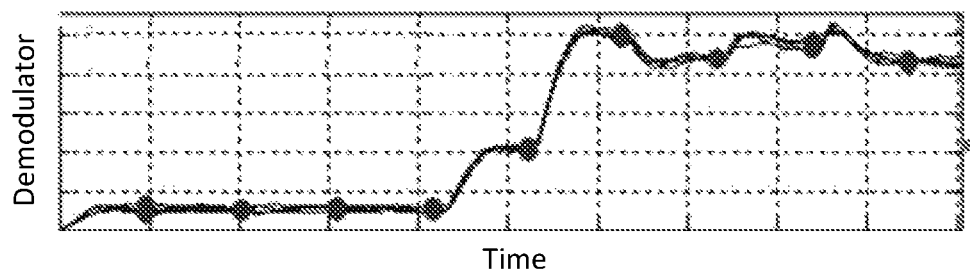

As the sweep from low to high $I_{bias}$ occurs, the sensor path 1214 senses modulation from the laser 1210 as a voltage or current across the sensor 1220. An example of the sensor signal is shown in the graph of FIG. 15. This signal is amplified bandpass-filtered and sent to the demodulator/envelop-detector 1222. The graph of FIG. 16 shows an example of the envelop detector output. The dots on the envelop detector curve in FIG. 16 represent the value of digitized sample sent to SoC/controller 1202. These samples are used for the aforementioned threshold, slope efficiency and other metrics of laser power.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method, comprising:
    before writing to a heat-assisted magnetic recording medium via a laser of a read/write head, applying a laser signal to the laser, the laser signal comprising a DC signal modulated with an AC signal;
    measuring, in response to different values of the DC signal, modulation levels of an optical power sensor that is coupled to detect optical output of the laser in response to the laser signal;
    determining a target value of the DC signal that causes the modulation levels to reach a predetermined value between zero and a maximum value, the target value defining a threshold current above which the laser begins to emit light; and
    setting a bias current for subsequent activation of the laser based on the threshold current.

2. The method of claim 1, wherein the subsequent activation of the laser comprises adding an operational current to the bias current to fully activate the laser for writing to the heat-assisted magnetic recording medium.

3. The method of claim 2, further comprising:
    determining a slope efficiency based on the modulation level of the optical power sensor; and
    modifying the operational current based on the slope efficiency.

4. The method of claim 1, wherein the modulation level of the optical power sensor as a function of the different values of the DC signal comprises an s-shaped curve asymptotically approaching zero as the laser signal becomes small enough not to activate the laser and approaching the maximum value as the laser signal becomes large enough to continuously activate the laser.

5. The method of claim 4, wherein the predetermined value of the modulation levels is between ¼ and ¾ of the maximum value.

6. The method of claim 1, wherein the optical power sensor detects the optical output of the laser based on detecting a temperature proximate a light delivery path of the read/write head.

7. The method of claim 1, wherein the method is performed during an adjacent track seek that occurs before writing to the heat-assisted magnetic recording medium.

8. A method comprising:
    applying two or more different modulated DC signals to a laser used for writing data to a heat-assisted magnetic recording medium;
    responsive to the two or more different modulated DC signals, measuring corresponding two or more modulation levels of an optical power sensor that is coupled to detect an optical output of the laser;

based on the two or more modulation levels of the optical power sensor, determining a target modulated DC signal that causes a target modulation level of the optical power sensor;

determining a threshold current of the laser that corresponds to a DC component of the target modulated DC signal; and setting a bias current of the laser based on the threshold current.

9. The method of claim 8, wherein the setting of the bias current occurs during the operation of a magnetic storage device and compensates for changes in properties of the laser over time.

10. The method of claim 8, wherein applying the two or more different modulated DC signals comprises applying two or more currents in the form of $I_{dc}+B \cos(\omega t)$ for different values of $I_{dc}$, where B and $\omega$ are constant.

11. The method of claim 8, further comprising, after setting the bias current, adding an operational current to the bias current to fully activate the laser for writing to the heat-assisted magnetic recording medium.

12. The method of claim 11, further comprising:
determining a slope efficiency of the laser based on the two or more modulation levels of the optical power sensor; and
modifying the operational current based on the slope efficiency.

13. The method of claim 8, wherein the optical power sensor comprises a bolometer.

14. An apparatus comprising:
circuitry that interfaces with:
a laser of a read/write head, the laser using in writing data to a heat-assisted magnetic recording medium; and
an optical power sensor that is coupled to detect optical output of the laser; and
a controller coupled to the circuitry and configured to perform a procedure comprising:
before writing to the heat-assisted magnetic recording medium, applying a laser signal to the laser, the laser signal comprising a DC signal modulated with an AC signal;
measuring, in response to different values of the DC signal, modulation levels of the optical power sensor;
determining a target value of the DC signal that causes the modulation levels to reach a predetermined value between zero and a maximum value, the target value defining a threshold current above which the laser begins to emit light; and
setting a bias current for subsequent activation of the laser based on the threshold current.

15. The apparatus of claim 14, wherein the subsequent activation of the laser comprises adding an operational current to the bias current to fully activate the laser for writing to the heat-assisted magnetic recording medium.

16. The apparatus of claim 15, wherein the procedure further comprises:
determining a slope efficiency based on the modulation level of the optical power sensor; and
modifying the operational current based on the slope efficiency.

17. The apparatus of claim 14, wherein the modulation level of the optical power sensor as a function of the different values of the DC signal comprises an s-shaped curve asymptotically approaching zero as the laser signal becomes small enough not to activate the laser and approaching the maximum value as the laser signal becomes large enough to continuously activate the laser.

18. The apparatus of claim 17, wherein the predetermined value of the modulation levels is between ¼ and ¾ of the maximum value.

19. The apparatus of claim 14, wherein the optical power sensor detects the optical output of the laser based on detecting a temperature proximate a light delivery path of the read/write head.

20. The apparatus of claim 14, wherein the procedure is performed during an adjacent track seek that occurs before writing to the heat-assisted magnetic recording medium.

* * * * *